United States Patent
Jones et al.

(10) Patent No.: US 6,579,788 B1
(45) Date of Patent: Jun. 17, 2003

(54) METHOD OF FORMING CONDUCTIVE INTERCONNECTIONS ON AN INTEGRATED CIRCUIT DEVICE

(75) Inventors: Clive Martin Jones, Austin, TX (US); Tim Z. Hossain, Austin, TX (US); Amiya R. Ghatak-Roy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 473 days.

(21) Appl. No.: 09/664,238

(22) Filed: Sep. 18, 2000

(51) Int. Cl.$^7$ .................. H01L 21/4763; H01L 21/44
(52) U.S. Cl. .................. 438/627; 438/653; 438/654; 438/656; 438/687; 438/692
(58) Field of Search ................. 438/653, 654, 438/656, 688, 627–629, 672, 687, 692 658, 685, 913

(56) References Cited

U.S. PATENT DOCUMENTS

| | | | | |
|---|---|---|---|---|
| 5,686,355 A | | 11/1997 | Sumi et al. ............... 437/192 |
| 6,140,228 A | * | 10/2000 | Shan et al. ............... 438/627 |
| 6,174,795 B1 | * | 1/2001 | Shih et al. ............... 438/597 |
| 6,245,654 B1 | * | 6/2001 | Shih et al. ............... 438/597 |
| 6,268,290 B1 | * | 7/2001 | Taguchi et al. ............. 438/688 |
| 6,271,129 B1 | * | 8/2001 | Ghanayem et al. ......... 438/675 |
| 6,297,147 B1 | * | 10/2001 | Yang et al. ............... 438/627 |
| 6,326,297 B1 | * | 12/2001 | Vijayendran ............. 438/627 |
| 6,331,483 B1 | * | 12/2001 | Ishizuka et al. ........... 438/648 |
| 6,399,440 B1 | * | 6/2002 | Miao ........................ 438/255 |
| 6,403,465 B1 | * | 6/2002 | Liu et al. .................. 438/627 |
| 6,403,466 B1 | * | 6/2002 | Lopatin .................... 438/627 |
| 6,410,383 B1 | * | 6/2002 | Ma .......................... 438/247 |
| 6,413,853 B2 | * | 7/2002 | Jang et al. ................ 438/627 |
| 6,455,419 B1 | * | 9/2002 | Konecni et al. ........... 438/653 |
| 6,465,347 B2 | * | 10/2002 | Ishizuka et al. .......... 438/648 |
| 6,475,907 B1 | * | 11/2002 | Taguwa ................... 438/648 |
| 6,475,912 B1 | * | 11/2002 | Harada .................... 438/687 |
| 6,498,095 B2 | * | 12/2002 | Matsuura ................. 438/652 |
| 6,524,956 B1 | * | 2/2003 | Tian et al. ................ 438/685 |

OTHER PUBLICATIONS

Tsai et al., "Layer Tungsten and its Applications for VLSI Interconnects," IEEE Meeting Technical Digest, Dec. 1988, pp. 462–465.

* cited by examiner

*Primary Examiner*—Michael S. Lebentritt
(74) *Attorney, Agent, or Firm*—Williams, Morgan & Amerson, P.C.

(57) ABSTRACT

A method of forming conductive interconnections is disclosed herein. In one illustrative embodiment, the method comprises forming an opening in a layer of insulation material, forming a first plurality of silicon seed atoms in the opening, and performing a first tungsten growing process to form tungsten material in the opening. The method further comprises forming a second plurality of silicon seed atoms in the opening above at least a portion of the tungsten material formed during the first tungsten growing process, and performing at least one additional tungsten growing process after forming the second plurality of silicon seed atoms to further form tungsten material in the opening.

21 Claims, 6 Drawing Sheets

METHOD OF FORMING CONDUCTIVE INTERCONNECTIONS ON AN INTEGRATED CIRCUIT DEVICE

BACKGROUND OF THE INVENTION

1. Field of the Invention

The present invention is directed to the field of semiconductor processing, and, more particularly, to a method of forming conductive interconnections on an integrated circuit device.

2. Description of the Related Art

There is a constant drive to reduce the size, or scale, of transistors to increase the overall speed of the transistor, as well as integrated circuit devices incorporating such transistors. A conventional integrated circuit device, such as a microprocessor, is typically comprised of millions of transistors formed above the surface of a semiconducting substrate. For the integrated circuit device to function, the transistors must be electrically connected to one another through conductive interconnections.

Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of alternating layers of conductive lines and conductive plugs formed in layers of insulating materials formed on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

By way of background, an illustrative transistor 10 that may be included in such an integrated circuit device is shown in FIG. 1. The transistor 10 is generally comprised of a gate insulation layer 14, a gate conductor 16, and a plurality of source/drain regions 18 formed in a semiconducting substrate 12. The gate insulation layer 14 may be formed from a variety of materials, such as silicon dioxide. The gate conductor 16 may also be formed from a variety of materials, such as polysilicon. The source and drain regions 18 may be formed by one or more ion implantation processes in which a dopant material is implanted into the substrate 12.

In one illustrative process flow, a first insulation layer 26 is formed above the transistor 10, and a plurality of openings 24 are formed in the first insulation layer 26. Thereafter, the openings 24 are filled with a conductive material, such as a metal, to form conductive plugs 22. In the illustrative transistor 10 shown in FIG. 1, the conductive plugs 22 are electrically coupled to the source and drain regions 18 of the transistor 10. Within the semiconductor industry, the conductive plugs 22 may be referred to as either contacts or vias. In general, conductive plugs that are coupled to regions of a transistor, e.g., source/drain regions, are referred to as contacts. Conductive plugs that serve other functions, such as connecting two different layers of conductive lines, are known as vias. However, different terminology may be employed within the industry to distinguish conductive plugs on this basis. Thus, as used herein, the term conductive plugs should be understood to include both contacts and vias.

Thereafter, a second insulation layer 32 may be formed above the first insulation layer 26. Multiple openings 30 may be formed in the second insulation layer 32, and the openings 30 may thereafter be filled with a conductive material to form conductive lines 28. Although only a single level of conductive plugs and a single level of conductive lines are depicted in FIG. 1, there may be multiple levels of plugs and lines interleaved with one another. This interconnected network of plugs and lines allows electrical signals to propagate throughout the integrated circuit device. The techniques used for forming the various components depicted in FIG. 1 are known to those skilled in the art and will not be repeated here in any detail.

The conductive plugs 22 and conductive lines 28 may be of any size or configuration, they may be formed by any of a variety of techniques, and they may be comprised of any of a variety of conductive materials. Traditionally, the conductive plugs 22 depicted in FIG. 1 have a circular cross-section, i.e., the plug is essentially a cylinder of material. However, the plug 22 can be made into any of a variety of shapes, e.g., square, rectangular, etc. Further, the insulation layers 26, 32 may be comprised of any insulating material, such as silicon dioxide or a low-k dielectric. Typically, the insulating layer 26 is formed by depositing the layer 26, and thereafter, subjecting it to a planarization operation, such as a chemical mechanical polishing ("CMP") operation, so as to produce an essentially planar surface 27. Next, the plurality of openings 24 are formed in the insulation layer 26 by performing a photolithographic process and one or more etching processes, e.g., an anisotropic plasma etching process.

Thereafter, a layer (not shown) of the appropriate conductive material, e.g., a metal, may be blanket-deposited, or otherwise formed, over the transistor 10, thereby filling the openings 24 formed in the first insulation layer 26. The metal layer (not shown) may thereafter be subjected to a CMP process to remove the excess material, thereby leaving the conductive plugs 22 in the openings 24.

Next, the insulation layer 32 is formed above the insulation layer 26, and the plurality of openings 30 may be defined in the insulation layer 32 through use of traditional photolithography and etching processes. Thereafter, the conductive line 28 is formed in the opening 30 in the insulation layer 32. As with the plug 22, the conductive line 28 may be formed in any of a variety of shapes, using any of a variety of known techniques for forming such lines, and may be comprised of a variety of materials. For example, the conductive line 28 may be comprised of tungsten, aluminum etc. That is, the conductive lines 28 may be formed by depositing or growing a layer of the appropriate conductive material in the openings 30.

As stated previously, the packing density of transistors formed on an integrated circuit device continues to increase. In turn, this necessitates that the conductive lines and plugs used to interconnect these various transistors also be reduced in size. FIGS. 2A–2C are enlarged, cross-sectional views that depict at least one problem encountered with forming conductive interconnections in modern integrated circuit devices. More particularly, as shown in FIG. 2A, a conductive line 46 is formed in an opening 45 formed in an insulation layer 40. Thereafter, an insulation layer 42 is formed above the insulation layer 40 and the conductive line 46, and an opening 44 is formed therein. A conductive plug 48 (see FIG. 2C) will ultimately be formed in the opening 44 in the insulation layer 42.

The opening 44 has an aspect ratio that is defined by the ratio of the depth "d" of the opening 44 as compared to the width "w" of the opening 44. As this aspect ratio increases, the act of filling the opening 44 with a conductive material becomes increasingly difficult. In modem semiconductor devices, the aspect ratio of a typical opening for a conductive plug may range from approximately 1–7. Moreover, there is continual pressure to increase the aspect ratio of these openings due to the requirement that transistors be densely packed in modem integrated circuit devices.

As shown in FIG. 2B, a layer of conductive material 41 is formed above the insulation layer 42 and in the opening 44. Due to the relatively high aspect ratio of the opening 41, the layer of conductive material 44 "pinches off" in a region indicated by arrow 43 and, in some instances, can result in the formation of a void 47 in the completed plug 48, as shown in FIGS. 2B–2C. This problem is commonly known in the industry by a variety of terms such as "breadloafing" or "keyholing."

The "breadloafing" or "keyholing" situation depicted in FIGS. 2A–2C is believed to be caused by a variety of factors. For example, in the case when the plug 48 is comprised of tungsten, the tungsten material tends to form more rapidly on the sidewalls 44A of the opening 44, as compared to a bottom surface 44B due to the larger surface area of the sidewalls 44A as compared to the bottom 44B, and because the tungsten starts to form on the sidewalls 44A prior to forming on the bottom 44B. Another reason for this problem occurring is that, as the tungsten is formed in the opening 44 using traditional prior art process flows, the grain size of the tungsten material tends to increase as the tungsten continues to be formed in the opening 44. This continual increase in the grain size of the tungsten material also at least assists in creating the "breadloafing" problems described above.

Although the void 45 is depicted in FIGS. 2B–2C, it may not be formed in all situations. Even when the void 45 is not formed, there may nevertheless be a large seam formed in the conductive plug 48 when it is completed. Additionally, although not depicted in FIGS. 2B–2C, a layer of barrier material, e.g, a barrier layer, may be formed in the opening 44 prior to forming the layer of conductive material 41 in the opening 44. This barrier layer may be a dual layer combination of titanium and titanium nitride. Thereafter, as indicated in FIG. 2C, a planarization operation may be performed on the structure depicted in FIG. 2B to result in a conductive plug 48.

In one illustrative prior art process flow, the layer of conductive material 41 is comprised of tungsten, and it may be formed by forming silicon seed atoms in the opening 44, and thereafter performing one or more tungsten growing processes to form the tungsten material in the opening 44. More particularly, the process may involve initially nucleating silicon seed atoms by using a given quantity of silane gas. Thereafter, by means of an exchange reaction using tungsten hexafluoride ($WF_6$), the tungsten atoms in the tungsten hexafluoride seek out the previously nucleated silicon atoms and essentially replace them. The process then continues with growing additional tungsten material in the opening until such time as the process is deemed completed. During this process flow, as the tungsten material is being formed in the opening 44, the grain size of the tungsten material tends to continually increase as more and more tungsten is formed in the opening. That is, the tungsten material initially formed by replacing the nucleated silicon seed atoms has a smaller grain size than subsequently formed tungsten material. This process continues as the tungsten material is formed in the opening 44.

The present invention is directed to solving, or at least reducing, some or all of the aforementioned problems.

SUMMARY OF THE INVENTION

The present invention is directed to a method of forming conductive interconnections on an integrated circuit device. In one illustrative embodiment, the method comprises forming an opening in a layer of insulation material, forming a first plurality of silicon seed atoms in the opening, and performing a first tungsten growing process to form tungsten material in the opening. The method further comprises forming a second plurality of silicon seed atoms in the opening above at least a portion of the tungsten material formed during the first tungsten growing process, and performing at least one additional tungsten growing process after forming the second plurality of silicon seed atoms to further form tungsten material in the opening.

BRIEF DESCRIPTION OF THE DRAWINGS

The invention may be understood by reference to the following description taken in conjunction with the accompanying drawings, in which like reference numerals identify like elements, and in which.

Figure 1:
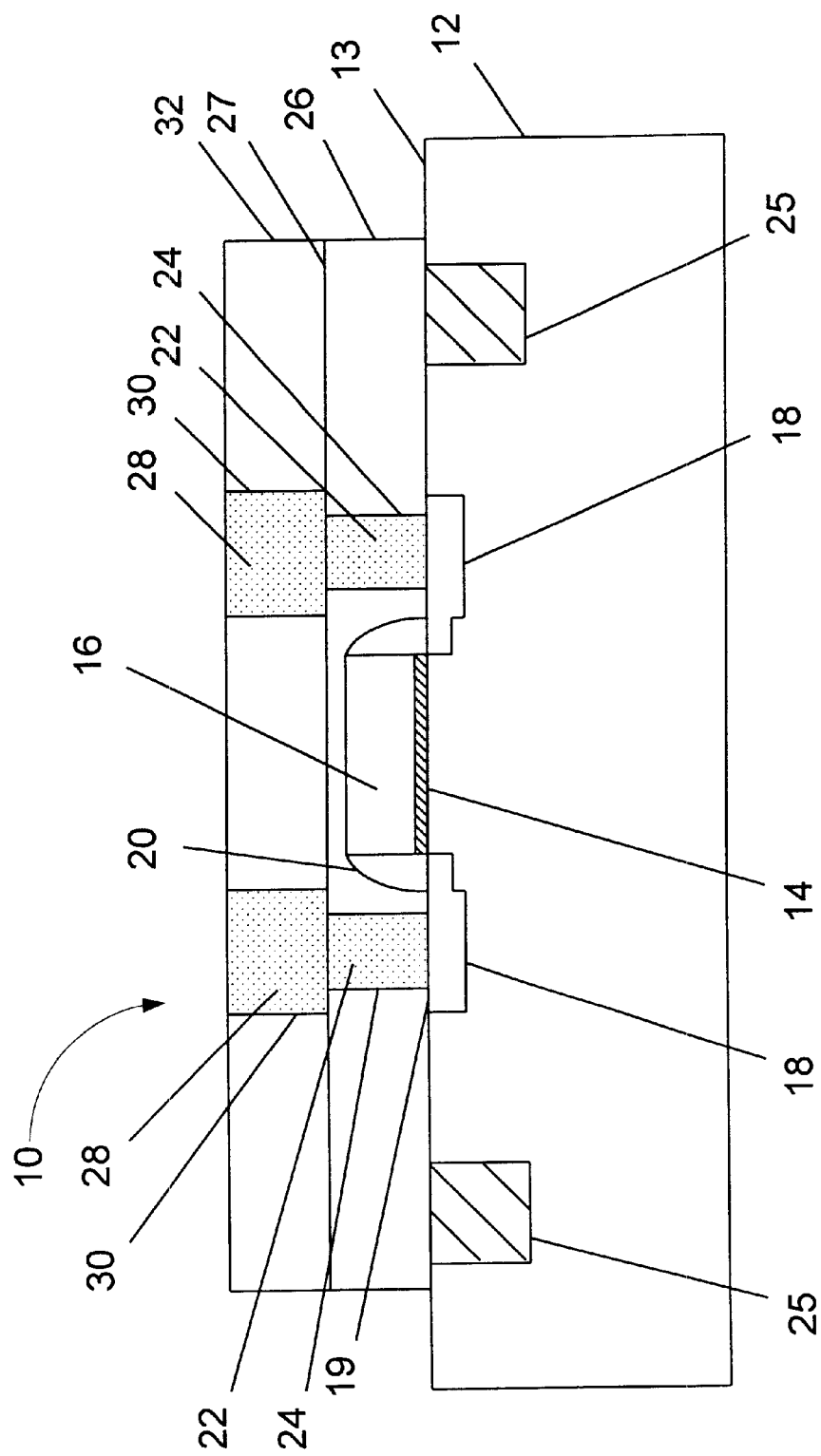
FIG. 1 is a cross-sectional view of an illustrative prior art transistor.
Figure 2A:
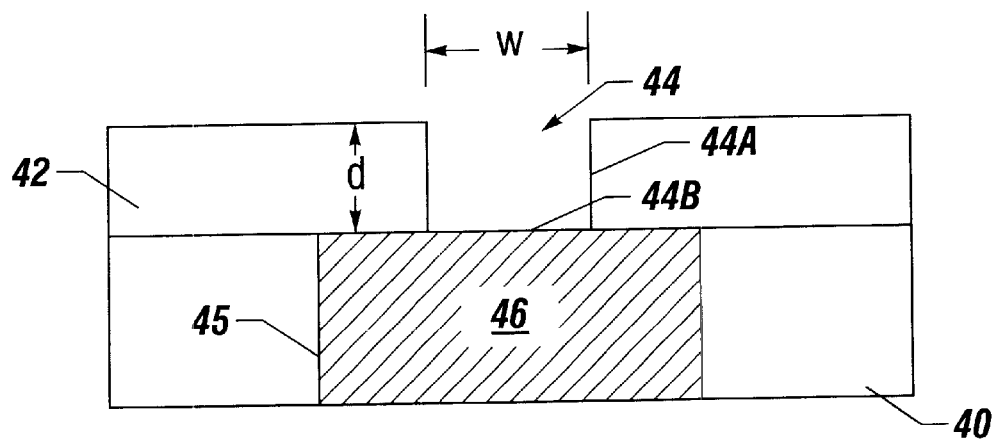
FIGS. 2A–2C are cross-sectional views of an illustrative conductive plug formed above a conductive line using an illustrative prior art.
Figure 2B:
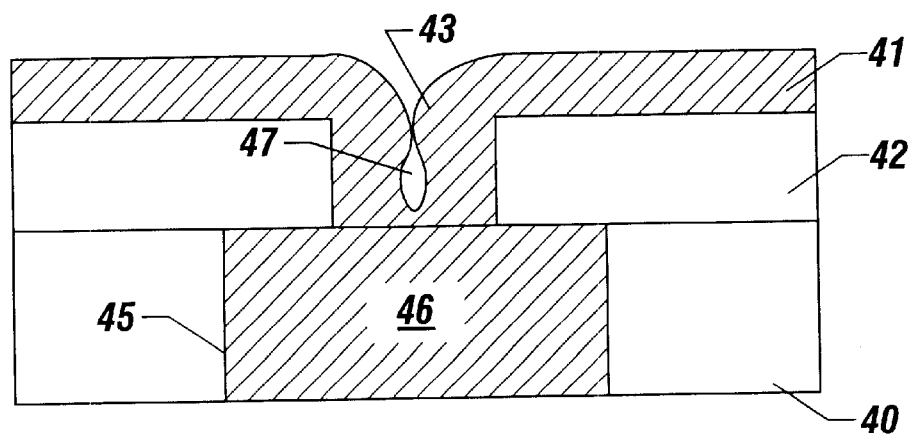
Figure 2C:
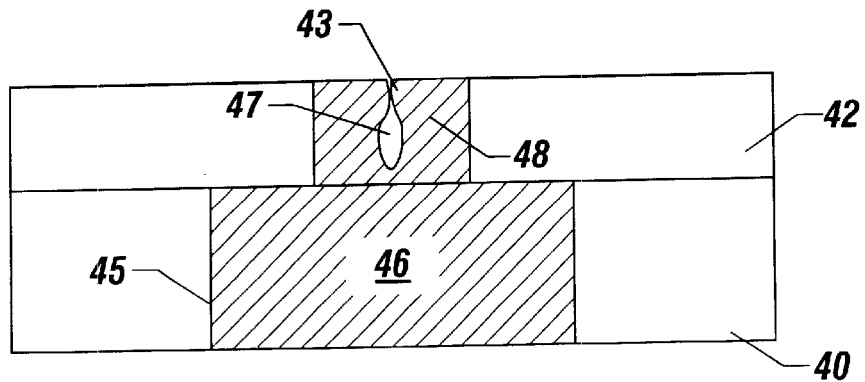

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 3–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features on fabricated devices.

Nevertheless, the attached drawings are included to describe and explain illustrative examples of the present invention.

In general, the present invention is directed to a method of forming conductive interconnections in an integrated circuit device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

The present invention will be discussed with reference to FIG. 3 and FIGS. 4A–4G wherein an illustrative, six-stage process may be employed to form conductive interconnections comprised of tungsten in an integrated circuit device. As will become clear to those skilled in the art upon a complete reading of the present application, the present invention is not limited to this disclosed, six-stage process. Rather, as shown more fully below, the present invention may be applied with a variety of process flow schemes and with many variations in the number of stages used to form the conductive interconnections. Thus, the disclosed embodiments should not be considered a limitation of the present invention unless specifically set forth in the appended claims.

Figure 3:
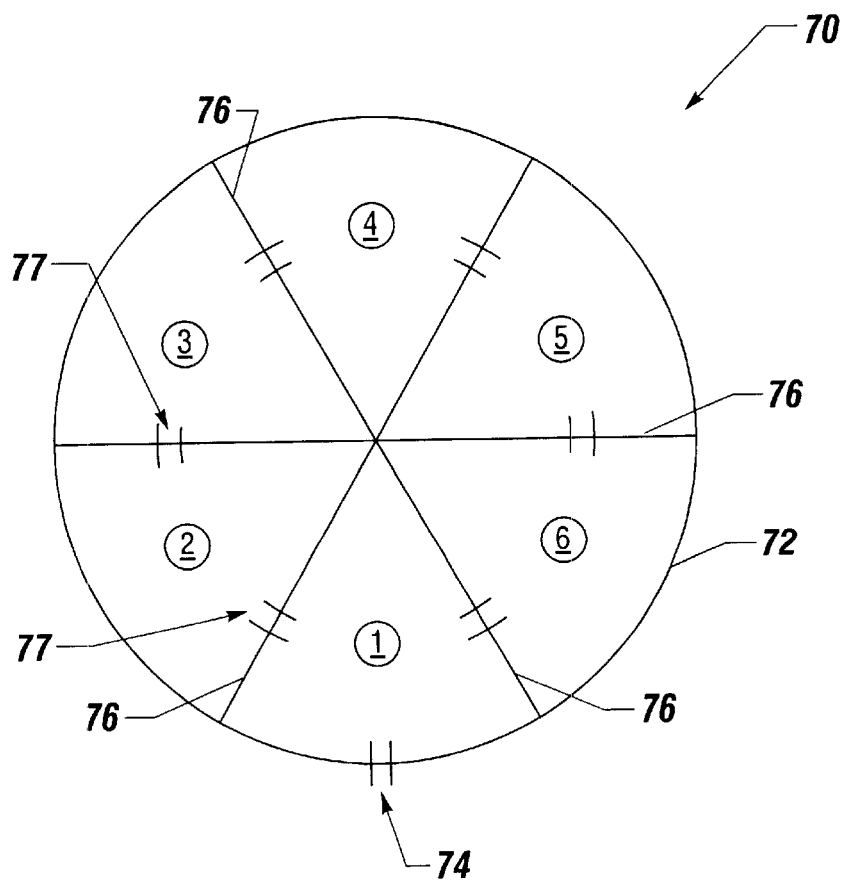
FIG. 3 is a schematically depicted processing tool that may be used with the present invention.

FIG. 3 depicts, schematically, an illustrative processing tool 70 wherein conductive interconnections comprised of tungsten may be formed in accordance with the present invention on an integrated circuit device. One illustrative tool that may be used with the present invention is a tungsten (W) CVD tool manufactured by Novellus. The tool 70 is comprised of a housing 72, and stations 1–6. At each of the stations 1–6, a showerhead (not shown), or similar structure, allows introduction of desired process gases at various flow rates into the station. Each of the stations 1–6 is essentially isolated from adjacent stations by means of isolation walls 76, or other similar structures. Wafers are passed from stage to stage through openings 77 by automated wafer transport mechanisms (not shown). The tool 70, when completely full, may contain one wafer at each of the respective stages. Of course, less than six wafers may be processed in the illustrative tool 70.

Typically, a wafer is introduced into stage 1 of the tool 70 via opening 74 in the tool. Thereafter, when processing at stage 1 is complete, the wafer is transferred to stage 2 for further processing. The process continues until the wafers have been subjected to the desired processing in the tool 70. As stated previously, the present invention may be employed in situations in which tungsten conductive interconnections may be formed using less or more than the illustrative six stages depicted in tool 70. Moreover, the present invention may be employed in tools that are adapted to hold any number of wafers, including a single wafer. For example, a tool to be used in the present invention may only have one station available for processing a wafer. Nevertheless, the present invention may be employed in such a tool by varying the process gases used in that tool at that station as described more fully herein.

In FIGS. 4A–4G, the present invention is disclosed in the context of forming a conductive plug 67 (see FIG. 4G) above a conductive line 64. However, as will be readily apparent to those skilled in the art upon a complete reading of the present application, the present invention may be used in forming conductive lines or plugs. Thus, the particular type of structure formed using the present invention should not be considered a limitation of the present invention unless it is specifically set forth in the appended claims.

Figure 4A:
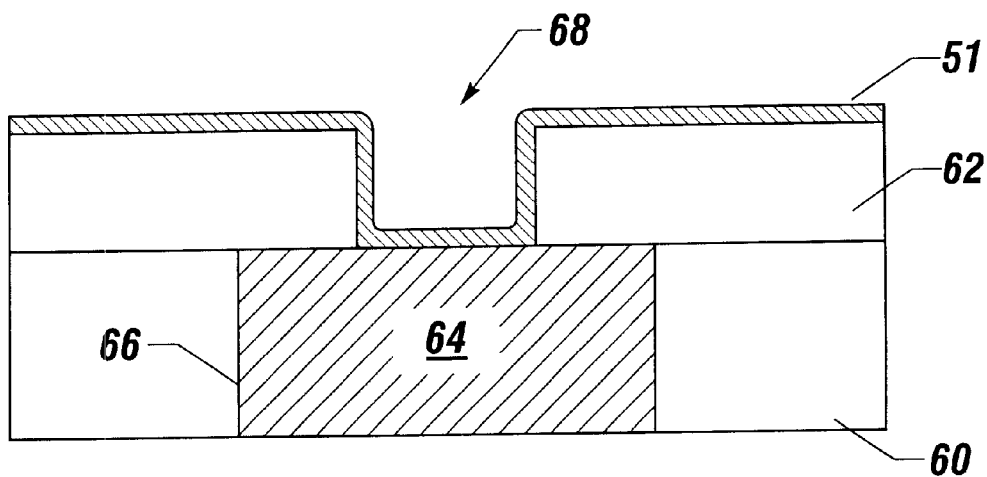
FIGS. 4A–4G are cross-sectional views depicting one illustrative process flow for forming a conductive interconnection in accordance with one embodiment of the present invention.
Figure 4B:
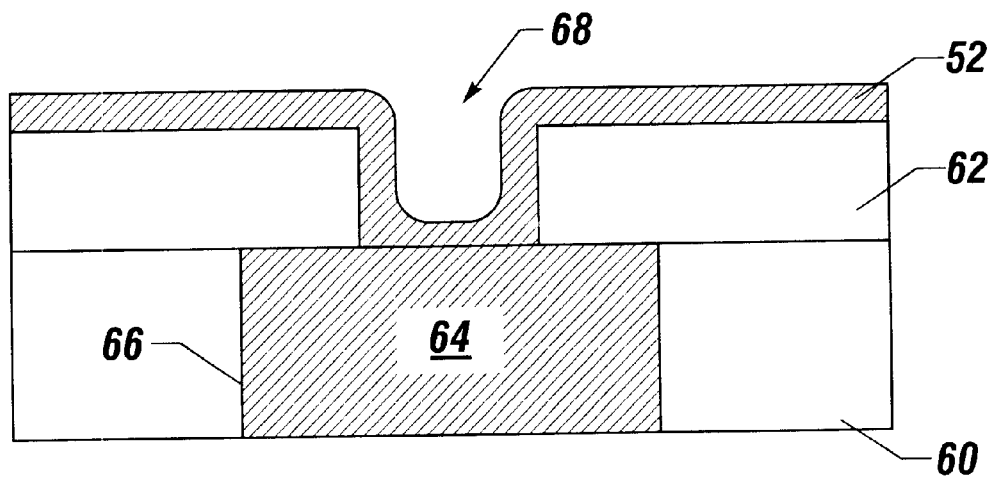
Figure 4C:
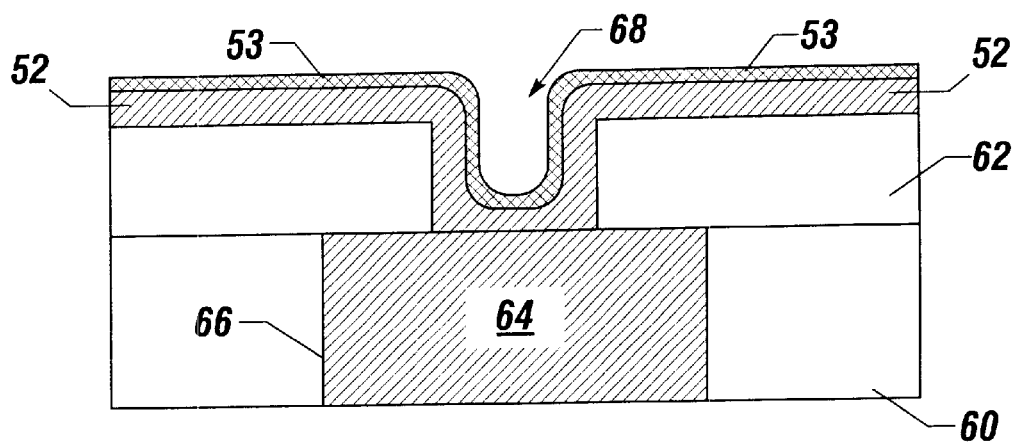

As shown in FIG. 4A, a conductive line 64 is formed in an opening 66 in an insulation layer 60. The conductive line 64 may be comprised of a variety of materials, such as tungsten, aluminum, copper, etc. The conductive line 64 may be any size, shape or configuration. Moreover, the insulation layer 60 may be comprised of a variety of materials, such as silicon dioxide or silicon oxynitride, or any other material that may serve the insulative purposes of the insulation layer 60. The conductive line 64 may be formed by a variety of known techniques for forming such structures. Thereafter, an insulation layer 62 is formed above the conductive line 64, and an opening 68 is formed in the insulation layer 62 above the conductive line 64. As with the previous insulation layer, the insulation layer 62 may be comprised of a variety of materials that are sufficient to serve the insulative function of the insulation layer 62. Although not depicted in FIGS. 4A–4G, a barrier layer, such as a titanium/titanium nitride bi-layer, may be formed in the opening 68 prior to beginning the process of forming the conductive plug 67. However, for clarity, the barrier layer has not been shown in the drawings.

As an overview, the present invention involves forming a conductive interconnection comprised of tungsten by forming silicon seed atoms in the opening 68, forming at least some tungsten material in the opening 68, forming additional silicon seed atoms on the previously formed tungsten material, and, thereafter, forming additional tungsten material in the opening 68. In essence, the present invention is directed to essentially restarting the tungsten formation process at various points during the interconnection formation procedure. This is accomplished by intermittently forming silicon seed atoms on formed tungsten material that was previously formed in the opening 68.

As an initial step in the present invention, silicon seed atoms are formed in the opening 68, as indicated by layer 51 in FIG. 4A. In one illustrative embodiment, this is accomplished by performing a first nucleation process whereby a first plurality of seed silicon atoms will be nucleated in the opening 68 and on the insulation layer 62 as indicated by the layer 51. If a barrier layer is used, the nucleated silicon atoms would be positioned on the barrier layer. This nucleation process may be performed at stage 1 of the illustrative processing tool 70. This nucleation process may be accomplished by introducing approximately 10–30 sccm of silane for a period of approximately 0.5–10 seconds at stage 1 of the processing tool 70. This process may be performed at a temperature ranging from approximately 100–700° C. and at a pressure ranging from approximately 1 mTorr–1 Torr. In one illustrative embodiment, this first nucleation process is performed using approximately 20 sccm of silane for a duration of approximately 5 seconds at a temperature of approximately 400° C. and at a pressure of approximately 50 mTorr.

Thereafter, the wafer is transported to stage 2 of the processing tool 70 wherein a tungsten filling process is performed to form tungsten material in the opening 68. This tungsten material is indicated by a layer 52 shown in FIG. 4B. This may be accomplished by using tungsten hexafluoride ($WF_6$) plus hydrogen. As an initial matter, an exchange reaction is performed between the tungsten atoms in the tungsten hexafluoride and the nucleated silicon atoms whereby the tungsten atoms essentially replace the previously nucleated silicon atoms in accordance with the following formula:

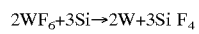

Thereafter, tungsten growth continues wherein the tungsten atoms that replace the silicon atoms essentially act as a seed for future tungsten growth. Please note that, in FIG. 4B, the layer 51, representing the originally nucleated silicon atoms, has been removed, indicating that the silicon atoms are substantially consumed by the tungsten growing process. The first tungsten growing process may be performed using tungsten hexafluoride at a flow rate ranging from approximately 50–400 sccm, for a duration ranging from approximately 5–90 seconds, at a temperature ranging from approximately 200–500° C., and at a pressure ranging from approximately 1–100 mTorr. In one illustrative embodiment, the first tungsten growing process may be performed using tungsten hexafluoride at a flow rate of approximately 400 sccm, for a duration of approximately 60 seconds, at a temperature of approximately 400° C., and at a pressure of approximately 40 mTorr.

This first tungsten growing process may be performed for a duration as deemed appropriate by the process engineer in control of these operations. However, at some point, the first tungsten growing process is stopped, and a second process is performed to form a second plurality of silicon seed atoms, as indicated by layer 53 in FIG. 4C, on the tungsten material 52 added during the first tungsten growing process. This second process used to form the layer 53 of silicon seed atoms is performed at stage 3 of the tool 70. The parameters for this second process used to form the silicon seed atoms may be substantially the same as the process parameters for the first nucleation process described above.

Figure 4D:
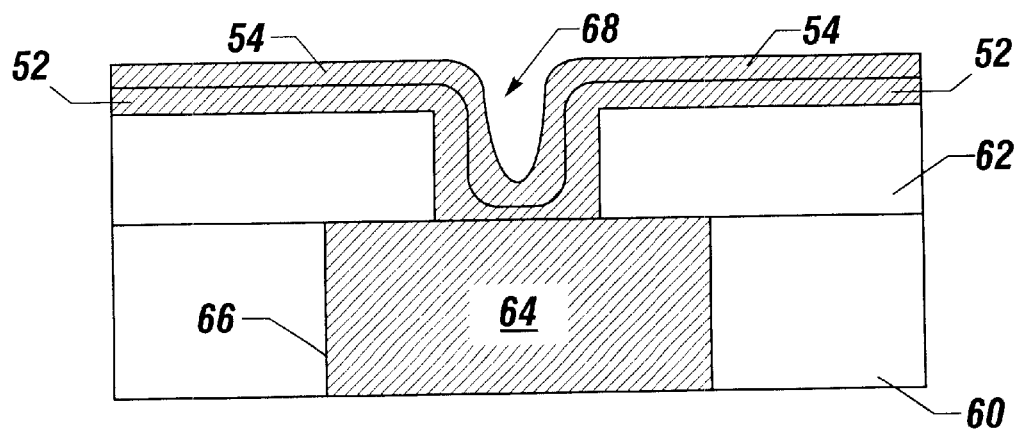

Thereafter, as indicated in FIG. 4D, a second tungsten growth process is performed to form additional tungsten material, as indicated by a layer 54, above the layer of tungsten material 52 formed during the first tungsten growing process. This second tungsten growth process may be performed at stage 4 of the processing tool 70. Note that in this second tungsten growth process, substantially all of the silicon seed layer 53 formed during the second nucleation process is removed. The process parameters for the second tungsten growth process may be varied as a matter of design choice. In one illustrative embodiment, the parameters of the second tungsten growth process are substantially the same as those described above with respect to the first tungsten growth process.

Figure 4E:
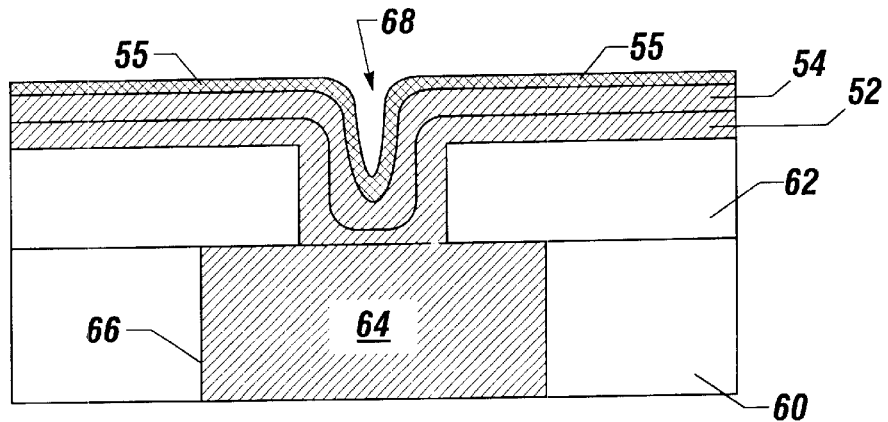

Next, as indicated in FIG. 4E, a third nucleation process may be performed to form silicon seed atoms, as indicated by a layer 55, above the tungsten material added during the second tungsten growth process, as indicated by the layer 54. The parameters for this third nucleation process may be substantially the same as those described above with respect to the first process used to form the silicon seed atoms. In the disclosed embodiment, this third silicon seed process will be performed at stage 5 of the tool 70.

Figure 4F:
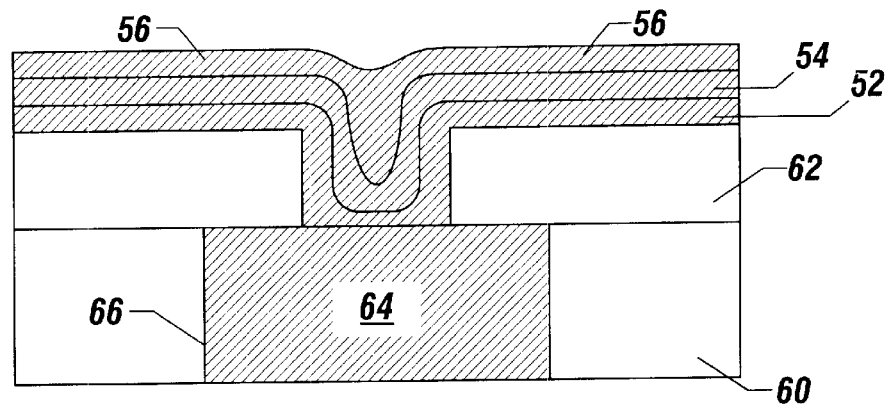

Thereafter, as indicated in FIG. 4F, a third tungsten growth process is performed to form additional tungsten material, as indicated by a layer 56, above the tungsten material, as indicated by the layer 54, that was formed during the second tungsten growth process. Note also that during this process, the silicon seed atoms, as indicated by a layer 55, formed during the third silicon seed process, are substantially removed. This third tungsten growth process may be performed, in the disclosed embodiment, at stage 6 of the tool 70. The parameters for this third tungsten growth process may be substantially the same as those for the first and second tungsten growth processes.

Figure 4G:
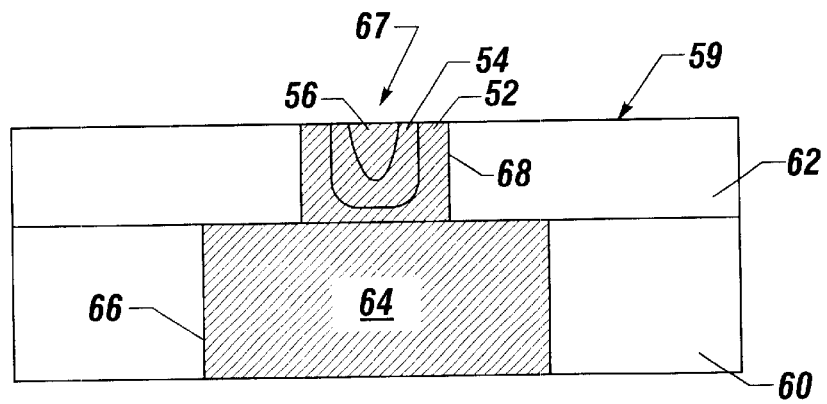

Thereafter, as indicated in FIG. 4G, a planarization operation, such as a chemical mechanical polishing operation, may be performed to remove the excess tungsten material from above a surface 59 of the insulation layer 62. This results in the conductive plug 67 shown in FIG. 4G. Please note that although distinct layers of tungsten (52, 54, and 56) are depicted in the drawings, in practice such distinct layers may not be visible. Nevertheless, distinct layers have been depicted in the drawings for purposes of explaining the present invention.

As stated previously, the present invention may employ fewer stages for manufacturing the conductive plug 67 disclosed in FIG. 4G. For example, in one illustrative embodiment, the present invention may be used whereby the first silicon seed process is performed to form silicon seed atoms in the opening 44, the first tungsten growth process is performed to form some tungsten material in the opening 44, the second silicon seed process is performed to form silicon seed atoms on the tungsten material formed during the first tungsten growth process, and a second and final tungsten growth process is performed to completely fill the opening 68 with tungsten material. That is, the third silicon seed process and the third tungsten growth process described above may be omitted. Moreover, the process parameters for the various silicon seed processes and tungsten growth processes may be varied. For example, the amount of tungsten grown during the first, second and third tungsten growth processes may be respectively increased as the processes are performed. Alternatively, relatively small amounts of tungsten may be formed during both the first and second growth processes, and a relatively larger amount of tungsten may be formed during the third tungsten growth process.

In one illustrative embodiment, the method of the present invention comprises forming an opening in a layer of insulation material, forming a first plurality of silicon seed atoms in the opening, and performing a first tungsten growing process to form tungsten material in the opening. The method continues with forming a second plurality of silicon seed atoms above at least a portion of the tungsten material formed during the first tungsten growing process and performing at least one additional tungsten growing process after forming the second plurality of seed atoms to further form tungsten material in the opening.

In another illustrative embodiment of the present invention, the method comprises forming an opening in a layer of insulation material, performing a first nucleation process to form a first plurality of silicon seed atoms in the opening, and performing a first tungsten growing process to form tungsten material in the opening. The method further comprises performing a second nucleation process to form a second plurality of silicon seed atoms above at least a portion of the tungsten material formed during the first tungsten growing process and performing at least one additional tungsten growing process after the second nucleation process to further form tungsten material in the opening.

Through use of the present invention, improved conductive interconnections may be formed. That is, through use of the present invention, i.e., by essentially "restarting" the tungsten growth process, the grain size of the tungsten material formed in the opening 68 may be reduced. This, in turn, may assist in reducing or eliminating the pinch-off and void problems created when forming tungsten in accordance with prior art processes whereby the grain size of the tungsten continues to grow as the tungsten material is formed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming conductive interconnections, comprising:

forming an opening in a layer of insulation material;

forming a first plurality of silicon seed atoms in said opening;

performing a first tungsten growing process to form tungsten material in said opening;

forming a second plurality of silicon seed atoms in said opening above at least a portion of said tungsten material formed in said first tungsten growing process; and performing at least one additional tungsten growing process after forming said second plurality of silicon seed atoms to further form tungsten material in said opening.

2. The method of claim 1, further comprising forming a barrier layer in said opening prior to forming said first plurality of silicon seed atoms.

3. The method of claim 1, wherein forming a first plurality of silicon seed atoms in said opening comprises performing a first nucleation process for a duration ranging from approximately 0.5–10 seconds using approximately 10–30 sccm of silane to form a first plurality of silicon seed atoms in said opening.

4. The method of claim 1, wherein performing a first tungsten growing process to form tungsten material in said opening comprises performing a first tungsten growing process for a duration ranging from approximately 10–90 seconds using approximately 300–400 sccm of tungsten hexafluoride ($WF_6$) and approximately 200–1500 sccm of hydrogen to form tungsten material in said opening.

5. The method of claim 1, wherein forming a second plurality of silicon seed atoms comprises performing a second nucleation process for a duration ranging from approximately 0.5–10 seconds using approximately 10–30 sccm of silane to form a second plurality of silicon seed atoms above at least a portion of said tungsten material formed in said first tungsten growth process.

6. The method of claim 1, wherein performing at least one additional tungsten growing process comprises performing at least one additional tungsten growing process for a duration ranging from approximately 10–90 seconds using approximately 300–400 sccm of tungsten hexafluoride ($WF_6$) and approximately 200–1500 sccm of hydrogen.

7. The method of claim 1, further comprising:

forming a third plurality of silicon seed atoms in said opening on at least a portion of said tungsten material formed during said at least one additional tungsten growing process; and performing a tungsten growing process after forming said third plurality of silicon seed atoms to further form tungsten material in said opening.

8. A method of forming conductive interconnections, comprising:

forming an opening in a layer of insulation material;

performing a first nucleation process to form a first plurality of silicon seed atoms in said opening;

performing a first tungsten growing process to form tungsten material in said opening;

performing a second nucleation process to form a second plurality of silicon seed atoms in said opening above at least a portion of said tungsten material formed in said first tungsten growing process; and performing at least one additional tungsten growing process after said second nucleation process to further form tungsten material in said opening.

9. The method of claim 8, further comprising forming a barrier layer in said opening prior to performing said first nucleation process.

10. The method of claim 8, wherein performing a first nucleation process to form a first plurality of silicon seed atoms in said opening comprises performing a first nucleation process for a duration ranging from approximately 0.5–10 seconds using approximately 10–30 sccm of silane to form a first plurality of silicon seed atoms in said opening.

11. The method of claim 8, wherein performing a first tungsten growing process to form tungsten material in said opening comprises performing a first tungsten growing process for a duration ranging from approximately 10–90 seconds using approximately 300–400 sccm of tungsten hexafluoride ($WF_6$) and approximately 200–1500 sccm of hydrogen to form tungsten material in said opening.

12. The method of claim 8, wherein performing a second nucleation process comprises performing a second nucleation process for a duration ranging from approximately 0.5–10 seconds using approximately 10–30 sccm of silane.

13. The method of claim 8, wherein performing at least one additional tungsten growing process comprises performing at least one additional tungsten growing process for a duration ranging from approximately 10–90 seconds using approximately 300–400 sccm of tungsten hexafluoride ($WF_6$) and approximately 200–1500 sccm of hydrogen.

14. A method of forming conductive interconnections, comprising:

forming an opening in a layer of insulation material;

performing a first nucleation process to form a first plurality of silicon seed atoms in said opening;

performing a first tungsten growing process to form tungsten material in said opening;

performing a second nucleation process to form a second plurality of silicon seed atoms in said opening above at least a portion of said tungsten material formed in said first tungsten growing process;

performing a second tungsten growing process after said second nucleation process to further form tungsten material in said opening;

performing a third nucleation process to form a third plurality of silicon seed atoms in said opening above at least a portion of said tungsten material formed in said second tungsten growth process; and performing a third tungsten growth process after said third nucleation process to further form tungsten material in said opening.

15. The method of claim 14, further comprising forming a barrier layer in said opening prior to performing said first nucleation process.

16. The method of claim 14, wherein performing a first nucleation process to form a first plurality of silicon seed atoms in said opening comprises performing a first nucleation process for a duration ranging from approximately 0.5–10 seconds using approximately 10–30 sccm of silane to form a first plurality of silicon seed atoms in said opening.

17. The method of claim 14, wherein performing a first tungsten growing process to form tungsten material in said opening comprises performing a first tungsten growing process for a duration ranging from approximately 10–90 seconds using approximately 300–400 sccm of tungsten hexafluoride ($WF_6$) and approximately 200–1500 sccm of hydrogen to form tungsten material in said opening.

18. The method of claim 14, wherein performing a second nucleation process comprises performing a second nucleation process for a duration ranging from approximately 0.5–10 seconds using approximately 10–30 sccm of silane.

19. The method of claim 14, wherein performing a second tungsten growing process comprises performing a second tungsten growing process for a duration ranging from approximately 10–90 seconds using approximately 300–400 sccm of tungsten hexafluoride ($WF_6$) and approximately 200–1500 sccm of hydrogen.

20. The method of claim 14, wherein performing a third nucleation process comprises performing a third nucleation process for a duration ranging from approximately 0.5–10 seconds using approximately 10–30 sccm of silane.

21. The method of claim 14, wherein performing a third tungsten growing process comprises performing a third tungsten growing process for a duration ranging from approximately 10–90 seconds using approximately 300–400 sccm of tungsten hexafluoride ($WF_6$) and approximately 200–1500 sccm of hydrogen.

* * * * *